United States Patent [19]

Yoshioka et al.

[11] Patent Number: 5,483,491
[45] Date of Patent: Jan. 9, 1996

[54] MEMORY CARD DEVICE

[75] Inventors: Shimpei Yoshioka; Kazuo Konishi; Koji Maruyama, all of Yokohama; Toshiaki Sato, Fukaya, all of Japan

[73] Assignee: Kabushiki Kaisha Toshiba, Kawasaki, Japan

[21] Appl. No.: 211,635

[22] PCT Filed: Nov. 30, 1992

[86] PCT No.: PCT/JP92/01565

§ 371 Date: Apr. 8, 1994

§ 102(e) Date: Apr. 8, 1994

[87] PCT Pub. No.: WO/9311491

PCT Pub. Date: Jun. 10, 1993

[30] Foreign Application Priority Data

Nov. 30, 1991 [JP] Japan ................................. 3-317169

[51] Int. Cl.$^6$ .................................................. G11C 11/40
[52] U.S. Cl. .................................. 365/200; 365/230.03
[58] Field of Search ........................ 365/200, 230.03, 365/218, 201, 185; 371/10.1, 10.2, 10.3; 235/380, 382

[56] References Cited

U.S. PATENT DOCUMENTS 5,278,794  1/1994  Tanaka ................................. 365/200
5,303,192  4/1994  Baba ................................. 365/230.03

FOREIGN PATENT DOCUMENTS

| 0392895 | 10/1990 | European Pat. Off. . |
| 56-93198 | 7/1981 | Japan . |
| 56-163600 | 12/1981 | Japan . |
| 63-219045 | 9/1988 | Japan . |
| 63-305444 | 12/1988 | Japan . |
| 4-75152 | 3/1992 | Japan . |
| 4123243 | 4/1992 | Japan . |

Primary Examiner—A. Zarabian
Attorney, Agent, or Firm—Cushman, Darby & Cushman

[57] ABSTRACT

The present invention relates to a memory card apparatus. When one of blocks of a data area of an EEPROM is detected as a defective block, a save area is searched for a vacant block, and data, which is to be written to the defective block, is written to the vacant block of the data area. When the save area is occupied and one of blocks of the data area is detected as a defective block, the data area is searched for a vacant block, and data, which is to be written to the defective block, is written to the vacant block of the data area. When a block of the data area is used for saving the defective block and a vacant block is generated in the save area by erasing data, data of the block of the data area used for saving the defective block is transferred to the vacant block.

8 Claims, 7 Drawing Sheets

| COMPARISON ITEMS | SRAM CARD | EEPROM CARD |
|---|---|---|
| 1. BACKUP BATTERY | YES | NO |
| 2. COST | HIGH | SOMEWHAT LOW |
| 3. WRITE SPEED (RANDOM) (PAGE) | HIGH --- | LOW SOMEWHAT HIGH |
| 4. READOUT SPEED (RANDOM) (PAGE) | HIGH --- | LOW SOMEWHAT HIGH |
| 5. ERASE MODE | NO | YES |
| 6. WRITE VERIFY | UNNECESSARY | NECESSARY |

F I G. 1

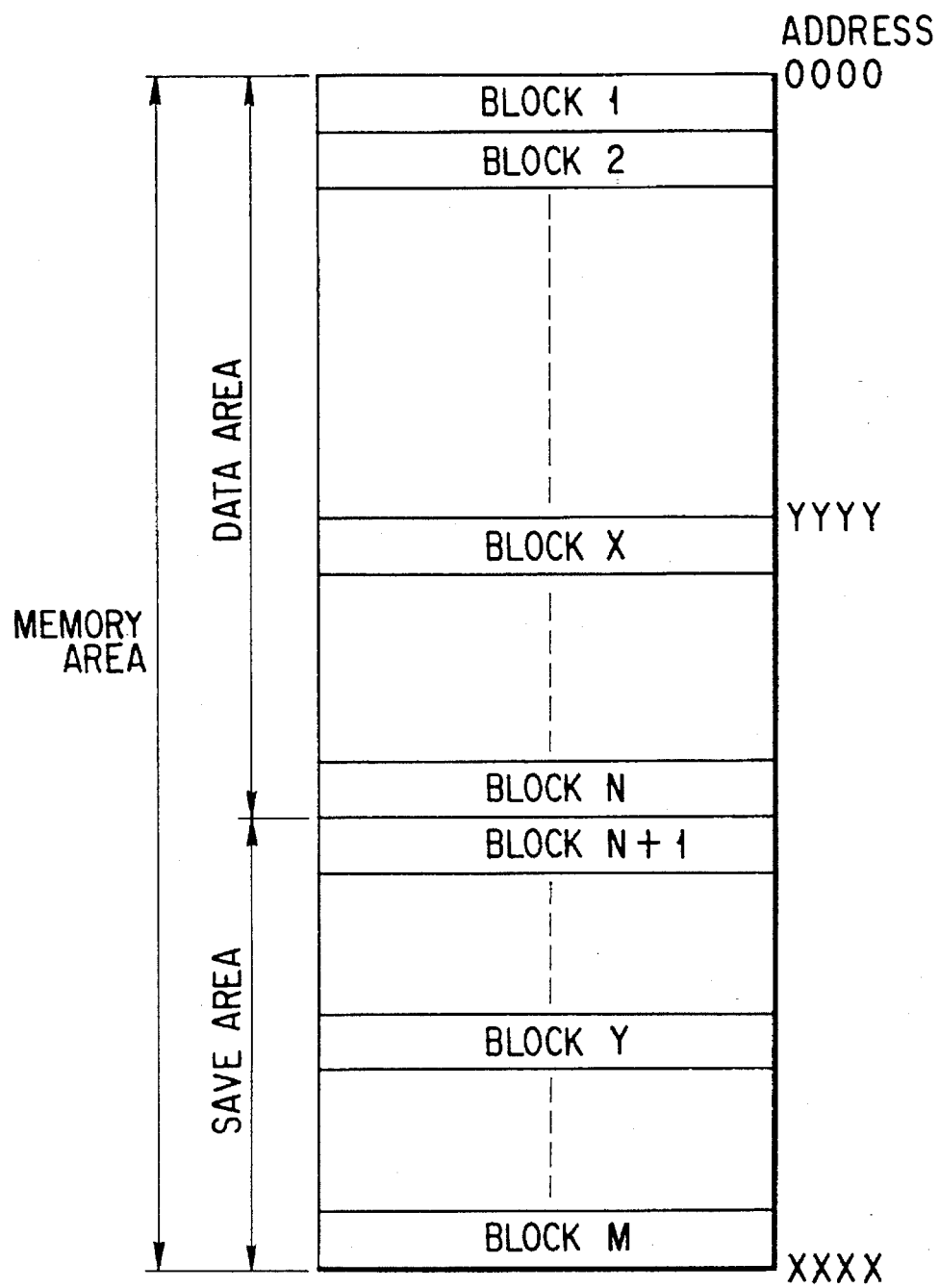
F I G. 3

FIG. 4

| | |
|---|---|
| N + 1 | A A A A |
| N + 2 | B B B B |
| N + 3 | C C C C |
| ⋮ | ⋮ |
| Y − 1 | D D D D |
| Y | 0 0 0 0 ← YYYY |
| ⋮ | ⋮ |
| M | 0 0 0 0 |

FIG. 5

| | |
|---|---|
| 1 | 1 1 1 1 |
| 2 | 1 1 1 1 |
| ⋮ | ⋮ |
| N − 1 | 0 0 0 0 ← YYYY |
| N | 1 1 1 1 |
| N + 1 | A A A A |
| N + 2 | B B B B |
| ⋮ | ⋮ |
| M | E E E E |

| | |
|---|---|
| 1 | 0 0 0 0 |
| 2 | 0 0 0 0 |
| ⋮ | ⋮ |
| X | 0 0 0 0 |
| ⋮ | ⋮ |
| M | 0 0 0 0 ← YYYY |

FIG. 7

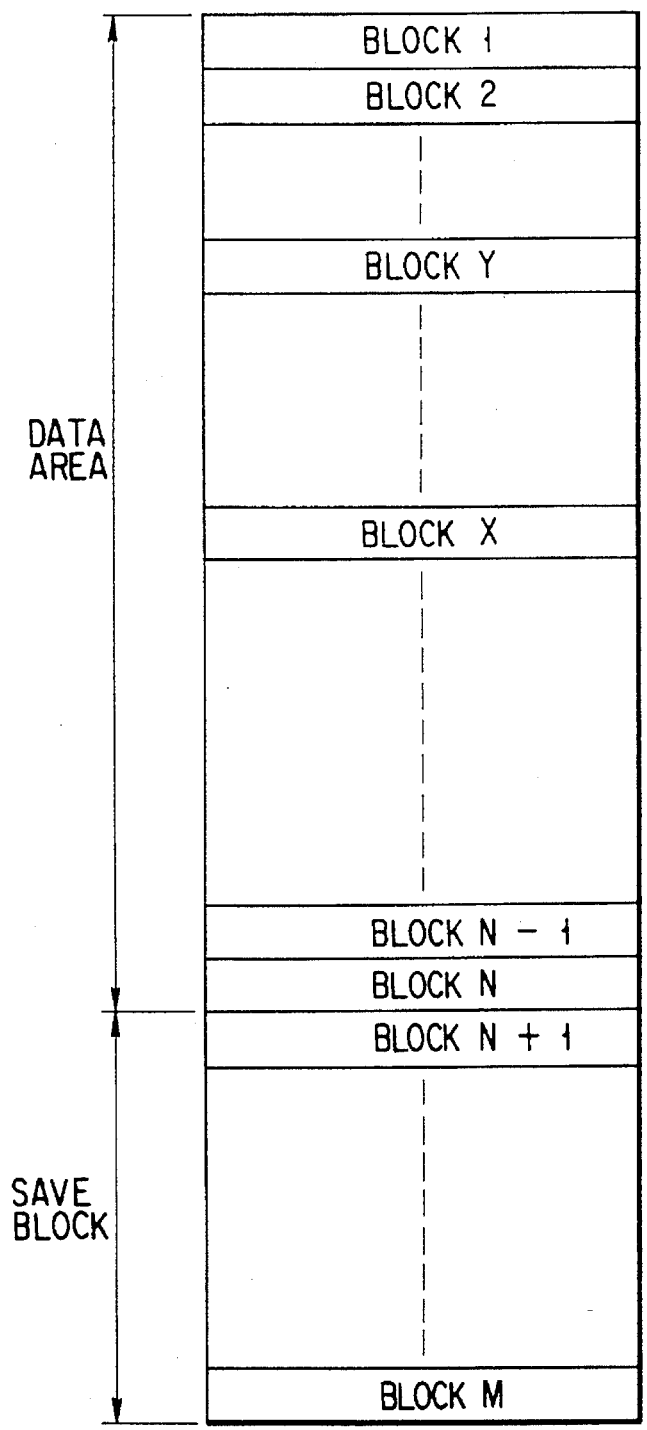
F I G. 8

MEMORY CARD DEVICE

TECHNICAL FIELD

This invention relates to a memory card device using an EEPROM (Electrically Erasable and Programmable Read Only Memory) as a semiconductor memory and, more particularly, to a memory card device suitably used for an electronic still camera apparatus or the like for converting an optical image of a photographed object into digital image data and recording the image data in a semiconductor memory.

BACKGROUND ART

As is well-known, an electronic still camera apparatus for converting an optical image of a photographed object into an electrical image signal using a solid-state imaging device, converting the image signal into digital image data, and recording the data in a semiconductor memory, has been developed. In this type of electronic still camera apparatus, a memory card including a semiconductor memory in a card-like case is formed detachably from the body of the camera apparatus so that the memory card can be handled in the same way as a film of a normal camera is.

At present, the memory card of the electronic still camera apparatus is being standardized, and a large memory capacity semiconductor memory for recording a plurality of items of digital image data is required as the semiconductor memory included in the memory card. For example, an SRAM (Static Random Access Memory), a mask ROM, an EEPROM capable of electrically writing and erasing data, and the like are taken into consideration, and a memory card using the SRAM has been already commercialized.

While the memory card using the SRAM has advantages wherein it can be adapted to a data structure of whatever format and the data write/readout speed is high, it has drawbacks wherein a backup battery for holding the written data has to be put into the memory card and thus a memory capacity is reduced by the space for the backup battery and the cost of the SRAM itself is increased uneconomically.

In order to eliminate the drawbacks of the SRAM, the EEPROM has attracted attention as a semiconductor memory used in a memory card. More specifically, the EEPROM attracts attention as a recording medium in place of a magnetic disk, and has the advantages of requiring no backup batteries and decreasing the cost of a chip which are different from those of the SRAM. Therefore, the EEPROM is greatly improving in using as a memory card.

FIG. 1 shows the merits and demerits of a memory card using an SRAM (SRAM card) and a memory card using an EEPROM (EEPROM card). With respect to the backup battery of item 1 and the cost of item 2 in FIG. 1, as described above, the SRAM card has problems wherein it requires a backup battery and increases in cost, and the EEPROM card has advantages wherein it requires no backup batteries and reduced in cost.

The write speed of item 3 and the readout speed of item 4 each can be considered in two different modes one of which is a random access mode common to the SRAM and EEPROM in which data is written/read out to/from an arbitrary byte or bit designated by an address and the other of which is a page mode proper to the EEPROM in which a page having a plurality of successive bytes (several hundreds of bytes) is designated and data is written/read at once for each page.

In the random access mode, the write and read speeds of the SRAM are both high, while those of the EEPROM are both low. Since, in the page mode, the EEPROM writes/reads a large amount of data for one page at once, its data write/read speed is higher than in the random access mode.

The erase mode of item 5 is a mode proper to the EEPROM and not included in the SRAM. More specifically, when the EEPROM writes new data in a region including old data, that is, when the EEPROM rewrites data, it cannot write the new data unless the old data is erased. For this reason, the erase mode is executed when data is written.

The write verify of item 6 is also a mode proper to the EEPROM and not included in the SRAM. Since the EEPROM cannot write data completely by a single normal operation, it is necessary to check whether data is correctly written to the EEPROM by reading the content of the data from the EEPROM every write operation for the EEPROM. This is the write verify.

More specifically, data to be written to the EEPROM is recorded in advance in a buffer memory, and the data is then transferred from the buffer memory to the EEPROM and written thereto. After that, the content of the data written to the EEPROM is read out and compared with that of the data recorded in the buffer memory to determine whether these contents coincide with each other. If it is determined that they do not coincide (error) by the write verify, the content of the buffer memory is repeatedly written to the EEPROM.

As is evident from the above comparison, while the EEPROM has the advantages of requiring no backup batteries, decreasing in cost, and allowing data to be written/read out for each page, it has the disadvantages of decreasing the data write/readout speed in the random access mode and requiring the modes such as the erase mode and write verify that the SRAM does not have.

In the case where the currently-used SRAM is replaced with an EEPROM as a semiconductor memory used in a memory card, it is necessary to make various improvements in the EEPROM so that the problems of decreasing the data write/readout speed, requiring the erase mode and write verify, and the like can be resolved, and the EEPROM can be handled in the same way as a memory card including the SRAM is, in other words, it can be used like an SRAM card.

The problem of this case is that the memory cell of the EEPROM is deteriorated suddenly when the number of times of data rewrite exceeds a fixed value, and a data write error is easy to occur. In other words, since the EEPROM is developed to record program data and intended to rewrite data in the version-up of programs, it cannot be adapted to a number of data rewrite operations.

If, as described above, an EEPROM is used as a semiconductor memory for a memory card used in an electronic still camera apparatus and the like, in place of an SRAM which has been conventionally used, it is reasonable to frequently rewrite data to the EEPROM. Inevitably, a write error is remarkably increased.

Conventionally, it is determined as a write error that data is not written correctly even though the foregoing write verify process is repeated by a predetermined number of times. Even when a write error occurs in part of the EEPROM, the whole memory card including the EEPROM is treated as a defective, which is very inefficient and uneconomical.

As described above, the conventional memory card including the EEPROM has the drawback of making the memory card very inefficient and uneconomical since the whole memory card is treated as a defective when a write error occurs in the EEPROM.

The present invention has been developed in consideration of the above situation and its object is to provide an economical, practical, and excellent memory card in which an EEPROM can be used when a write error occurs in part of the EEPROM and its memory area can be used effectively.

DISCLOSURE OF INVENTION

A memory card apparatus according to the present invention comprises:

EEPROMs each having a data area and a save area including a plurality blocks each having a fixed capacity;

save means for, when one of the blocks of the data area is detected as a defective block in writing, searching the save area for a vacant block and writing data, which is to be written to the defective block, to the vacant block and, when the save area is occupied and one of the blocks of the data area is detected as a defective block in writing, searching the data area for a vacant block of the data area and writing data, which is to be written to the defective block, to the vacant block; and control means for, when one of the blocks of the data area is used for saving the defective block by the save means, detecting that a vacant block is generated in the save area by erasing data and transferring the data of the block of the data area used for saving the defective block to the vacant block generated in the save area.

With the above constitution, when one of blocks of the data area is detected as a defective block in writing, the save area is searched for a vacant block, and data, which cannot be written to the defective block, is written to the vacant block of the save area. Therefore, the use of an EEPROM having the defective block can be continued, and the EEPROM is economical and practical. Further, when the save area is occupied, a vacant block of the data area is used to save a defective block. When a vacant block is generated in the save area by erasing data, data of a block of the data area used for saving a defective block is automatically transferred to the vacant block of the save area. Therefore, more vacant blocks can be secured in the data area, and the memory area of the EEPROM can be used effectively.

The memory card apparatus according to the present invention comprises:

an EEPROM having a data area including a plurality blocks each having a fixed capacity;

save means for, when one of the blocks of the data area of the EEPROM is detected as a defective block in writing, searching the data area for vacant blocks and writing data, which is to be written to the defective block, to the vacant blocks;

first control means for controlling the blocks to which data has been written by the save means such that the blocks are arranged continuously within the data area; and second control means for, when the blocks are arranged continuously by the first control means and one of the blocks to which data has been written is selected as a save block, transferring the data of the block to a vacant block of the data area, thereby maintaining the save blocks continuously.

Since the save area is not fixed but its save blocks are increased by the save means whenever a defective block in writing is detected, the data area can be used effectively. Furthermore, when the save blocks are arranged continuously within the data area by the first and second control means, and the blocks to which data has been written are selected as save blocks, the data of the blocks is transferred to vacant blocks of the data area to maintain the save blocks continuously. Therefore, the plural save blocks are not scattered within the memory area, and both the data area and save blocks can be easily controlled.

BRIEF DESCRIPTION OF DRAWINGS

FIG. 1 is a view showing the merits and demerits of an SRAM card and an EEPROM card;

FIG. 3 is a view showing a memory area of the EEPROM of the memory card shown in FIG. 2;

FIG. 4 is a view showing details of a management table of the memory card shown in FIG. 2;

FIG. 5 is a view showing measures taken when a save area is occupied in the memory card shown in FIG. 2;

FIG. 7 is a view showing details of a management table of the memory card shown in FIG. 6; and FIG. 8 is a view showing a recording operation for the EEPROM of the memory card shown in FIG. 6.

BEST MODE OF CARRYING OUT THE INVENTION

Figure 2:
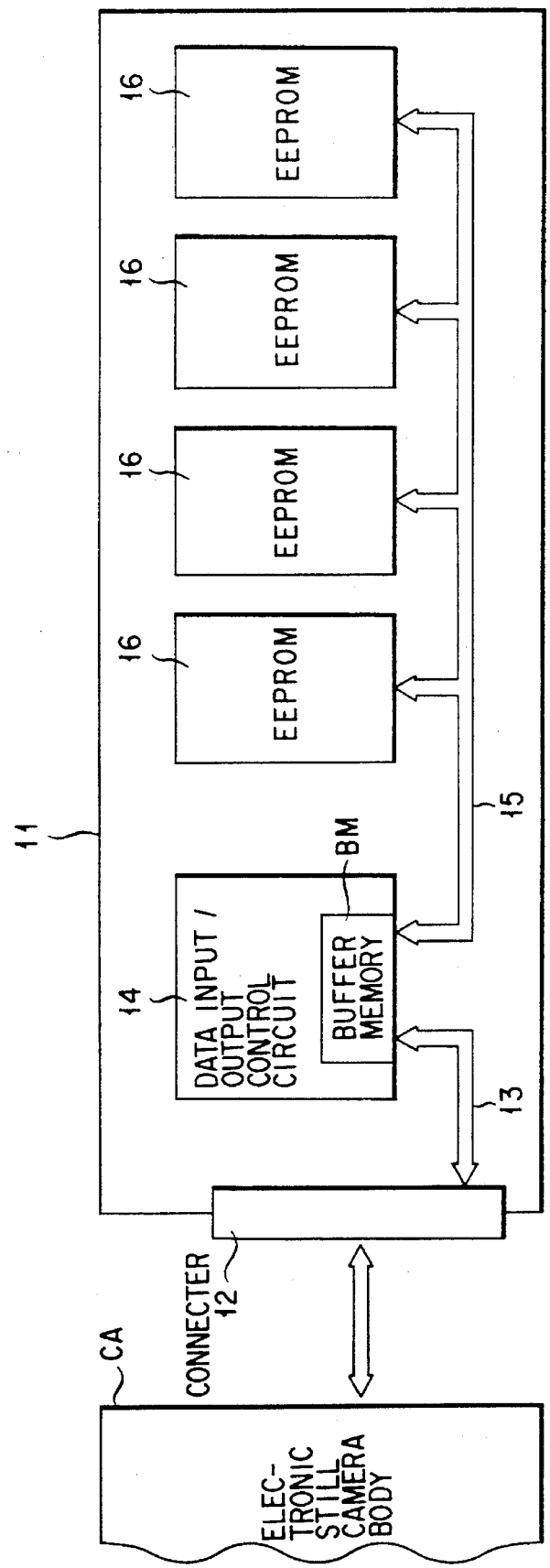
FIG. 2 is a block diagram showing a constitution of a memory card according to an embodiment of the present invention.

A memory card according to an embodiment of the present invention, which is applied to an electronic still camera apparatus, will now be described in detail with reference to the accompanying drawings. In FIG. 2, reference numeral 11 indicates a memory card body which is connected to an electronic still camera body CA by means of a connector 12 attached to one end portion of the memory card body. The connector 12 is supplied with data to be written to the memory card body 11, address data representing a location where the data is written, and the like, from the electronic still camera body CA.

The data supplied to the connector 12 is input to a data input/output control circuit 14 through a bus line 13. The data input/output control circuit 14 includes a buffer memory BM capable of writing/reading data at high speed, and stores the input data in the buffer memory BM. After that, the data input/output control circuit 14 reads out the data from the buffer memory BM through a bus line 15 at the timing corresponding to a write cycle of each of EEPROMs 16 and records it therein.

In the above case, whenever data of every page is written to the EEPROM 16, the data input/output control circuit 14 reads out the data from the EEPROM 16 and performs a write verify operation to determine whether the read-out data coincides with the data recorded in the buffer memory BM. If the data read out from the EEPROM 16 does not coincide with the data recorded in the buffer memory BM, the data input/output control circuit 14 transfers data from the buffer memory BM to the EEPROM 16 and writes it thereto again. When both the data quite coincide with each other, the data write operation is completed.

In the case where data is read out from the respective EEPROMs 16 and supplied outside the memory card body 11, the data input/output control circuit 14 is supplied with an address for designating data to be read out from the electronic still camera side through the connector 12. The data input/output control circuit 14 thus reads out the data from the EEPROM 16 based on the supplied address and records it in the buffer memory BM. The data input/output control circuit 14 then reads out the data recorded in the buffer memory BM and externally supplies it through the connector 12, thus performing a data readout operation.

According to the above-described constitution, since data transfer between the electronic still camera body CA and memory card body 11 is always executed by the buffer memory BM, the speed at which data is written/read out to/from the memory card body 11 with respect to the electronic still camera body CA, can be improved. Since, furthermore, a write verify operation proper to the EEPROMs 16 is automatically performed in the memory card body 11 using the buffer memory BM, the memory card body 11 can be used like the SRAM card.

As shown in FIG. 3, the EEPROMs 16 each includes a memory area of 0000 to XXXX addresses, and the memory area is divided into plural blocks 1 to M each of which is the minimum unit for processing data and has a fixed capacity (usually several kilo bytes). Of these blocks, the blocks 1 to N constitute a data area for recording normal data. The data area can be accessed directly from outside the memory card body 11, and is capable of repeating writing/reading data of every page of several hundreds of bytes by designating the addresses directly by means of the connector 12 to freely write/read the data in block unit.

The blocks N+1 to M constitute a save area wherein data, which has not been written to the data area because of a write error, is written. The save area is inhibited to be directly accessed from outside the memory card body 11, and the write/read operation for the save areas is performed in response to an instruction from the data input/output control circuit 14.

FIG. 4 shows a management table of the save areas in each of the EEPROMs 16. The management table is so constructed that the block numbers N+1 to M of the save areas correspond to their respective initial addresses of the blocks of the data area in which a write error occurs. The blocks of the data area are set to 0000 before the initial addresses are written. According to FIG. 4, the blocks N+1 to Y−1 are already used to correct a write error, and the initial addresses AAAA to DDDD are recorded in the blocks of the data area in which write errors occur.

A case where a write error occurs when data is written to a block X of the data area, will now be described. In this case, the data input/output control circuit 14 determines that a write error occurs in the block X when no coincidence is obtained even though a write verify processing is executed with respect to the block X by a predetermined number of times. The data input/output control circuit 14 then searches the management table shown in FIG. 4 for a vacant block in the save area.

Since, in this case, block number Y is vacant, the data input/output control circuit 14 selects a block Y of the save area and writes the data, which has not been written to the block x, to the block Y. If the data is written to the block X by the write verify process, the initial address YYYY of the block X is written to the block Y of the management table, thus completing the save operation.

To read out data from the EEPROM 16, the data input/output control circuit 14 compares the initial address of a block of the data area from which data is required to be read out by an address from outside with all the initial addresses written to the management table and, if they coincide, reads out the data from a block of the save area corresponding to the coincident initial address.

To erase data of the EEPROM 16, as in the case of data readout, the data input/output control circuit 14 compares the initial address of a block of the data area from which data is required to be read out by an address from outside with all the initial addresses written to the management table and, if they coincide, erases the data from a block of the save area corresponding to the coincident initial address.

Since the above save area is also included in the EEPROM 16, there is a case where a write error occurs in the blocks N+1 to M. In this case, the data input/output control circuit 14 records a use inhibit flag in the block of the management table in which the write error occurs, in place of the initial address of the block. For example, an address "1111" which is not present in the data area, is selected for the use inhibit flag. If a write error occurs in a vacant block Y of the retrieved save area, the data input/output control circuit 14 searches the management table for the next vacant block Y+1 and causes data to be written thereto.

If the save area is occupied and a write error occurs in a block of the data area, then a vacant block of the data area can be used for the save area. In this case, as shown in FIG. 5, the management table is so constructed as to have one-to-one correspondence between all the block numbers 1 to M having the data and save areas and the initial addresses of the blocks of the data area where write errors occur. Address "1111" is recorded, as a use inhibit flag, in the block of the data area which has been used normally for recording data, and address "0000" is recorded in the block of the data area where no data has been recorded yet.

A case where the save area is occupied and a write error occurs when data is written to a block X in the data area, will now be described. When the data input/output control circuit 14 determines the block X to be defective in writing, it searches the management table for a vacant one of blocks N+1 to M within the save area. If it determines that the save area includes no vacant blocks, the data input/output control circuit 14 searches the data area of the management table for a vacant one of blocks 1 to N.

Since, in this case, the block N−1 is vacant, the data input/output control circuit 14 writes data, which cannot be written to the block X, to the vacant block N−1. If the data is written by the write verify process, the initial address YYYY of the block X is written to the block N−1 of the management table, thus completing the save operation.

Assume that, as described above, the save area is occupied, a block of the data area is used therefor, and unnecessary data recorded in the EEPROM 16 is erased. Further, assume that the erased data is divided into three pieces of data recorded in their respective blocks 1, 2 and 3, one of the blocks (e.g., block 2) is defective in writing, and the piece of data to be written to the defective block 2 is written to the block N+2 of the save area. If the data is erased, the blocks 1, 3, and N+2 becomes vacant, in other words, the vacant block N+2 is generated in the occupied save area.

In the memory card body 11, as described above, part of the data area is used for save when the save area is occupied. Since the data area can be accessed directly from outside the memory card body 11, in other words, since the capacity of the data area is equal to the total data recording capacity of the memory card body 11 when the memory card body 11 is seen from outside, the use of the data area for the save area means that the total data recording capacity of the memory card body 11 is reduced when the memory card body 11 is seen from outside.

When the data is erased and then a vacant block is generated in the save area as described above, the data input/output control circuit 14 automatically transfers data of the block (block N−1 in FIG. 5) used as a save block in the data area to the vacant block N+2 of the save area, and prevents the total data recording capacity of the memory card body 11, which is seen from outside, from being decreased unnecessarily, with the block N−1 of the data area vacant.

With the constitution of the memory card according to the above embodiment, when a write error occurs in a block of the data area, the management table is searched for a vacant block of the save area, data, which cannot be written to the block with the write error, is written to the vacant block of the save area. Consequently, the EEPROM 16 in part of which a write error occurs can be used continuously as it is, thus making the memory card economical and practical.

If the save area is occupied, a vacant block of the data area is used as a save block and, when a vacant block is generated in the save area by erasing data, data of the vacant block of the data area is automatically transferred to the vacant block of the save area to secure vacant blocks in the data area. Therefore, the memory area of the EEPROM 16 can be used effectively.

Figure 6:
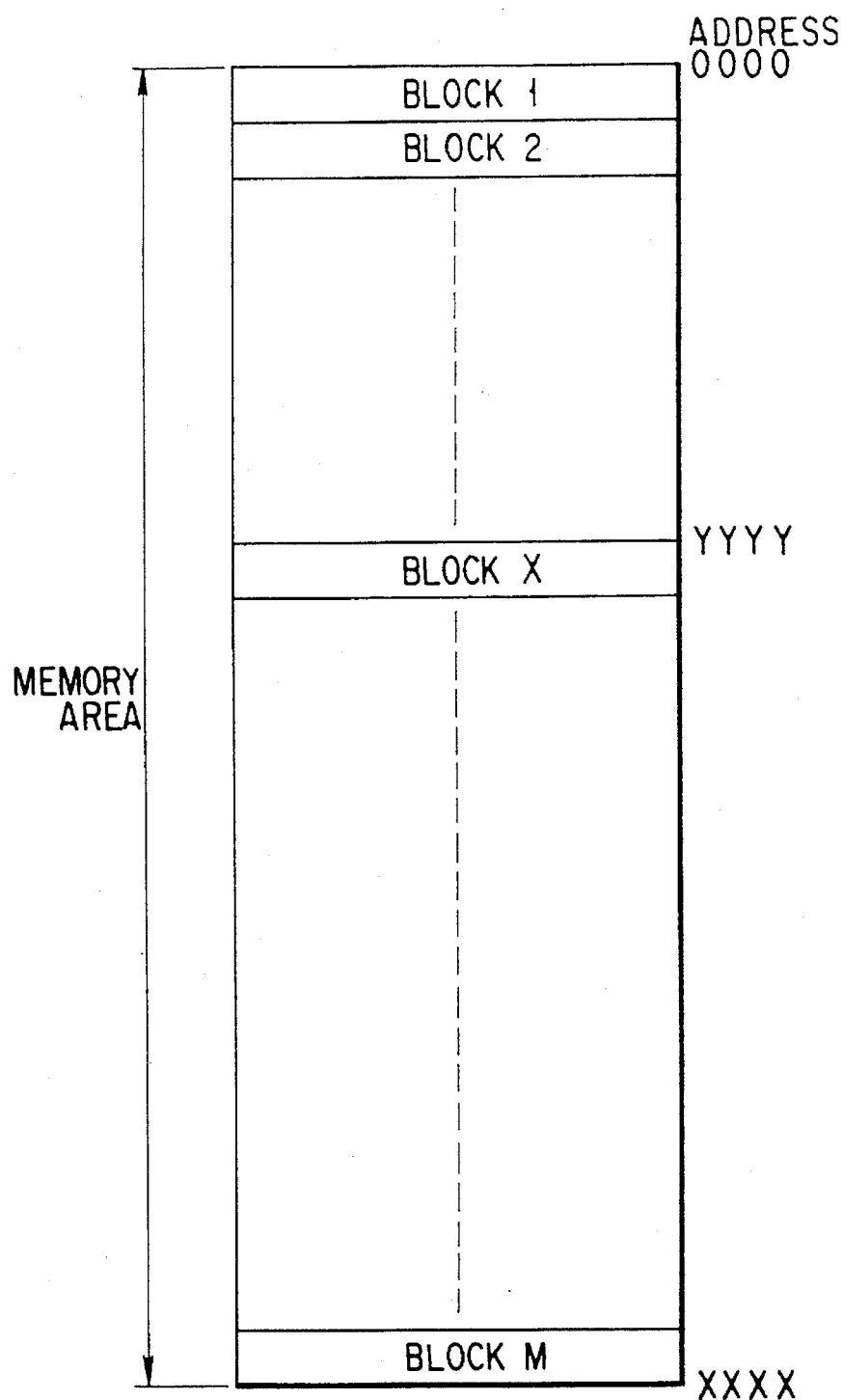
FIG. 6 is a view showing a memory area of an EEPROM of a memory card according to another embodiment of the present invention.

FIG. 6 shows another embodiment of the present invention. As shown in FIG. 6, each of the EEPROMs 16 includes a memory area having addresses 0000 to XXXX, and the memory area is divided into a plurality of blocks 1 to M. In the initial state, all the blocks 1 to M are data areas for recording normal data, and data can freely be written/read out to/from each of the blocks by designating the addresses from outside the memory card body 11.

Figure 7:
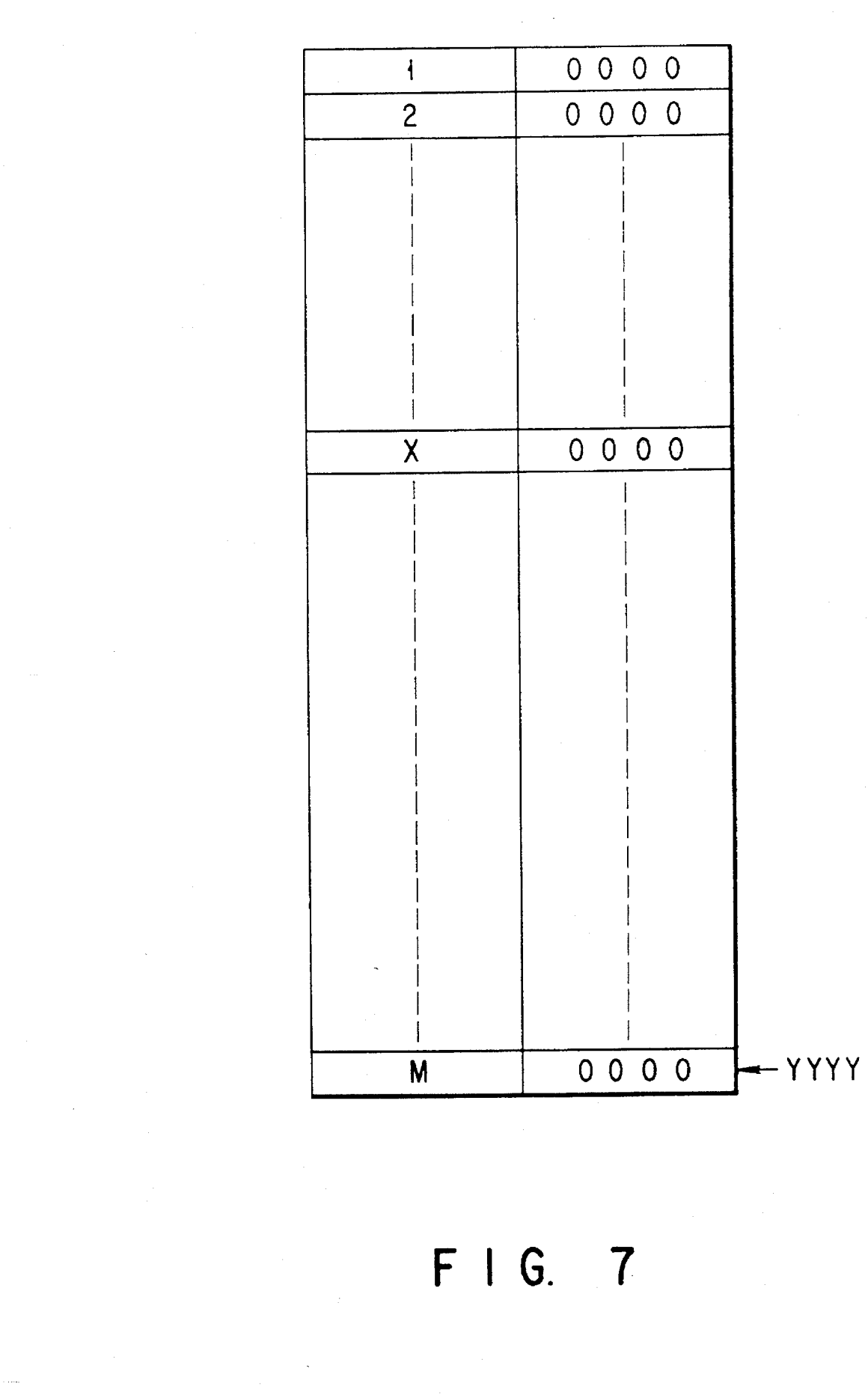

FIG. 7 shows a management table formed in each of the EEPROMs 16. In FIG. 7, the left column of the management table indicates block numbers 1 to M, and the right column thereof indicates whether the block numbers correspond to a data area or a save area. The management table is so constructed as to have one-to-one correspondence between the block numbers of blocks of the save area and the initial addresses of defective blocks with write errors. FIG. 7 shows the initial state, and an address 0000 representing an unused block is set to all the blocks.

A case where a write error occurs when data is to be written to the block X, will now be described. The data input/output control circuit 14 determines that a write error occurs in the block X when no coincidence is obtained even though a write verify processing is executed with respect to the block X by a predetermined number of times. The data input/output control circuit 14 then searches the management table shown in FIG. 7 from the end block M for a vacant block (table content 0000).

In this case, since the block M is vacant, the data input/output control circuit 14 selects it as a save block and writes data, which cannot written to the block X, to the save block M. If the data is written by the write verify processing, the initial address YYYY of the block X is written to the block M of the management table, thus completing the save operation.

If a write error occurs in another block, the data input/output control circuit 14 selects a block M−1 as a save block. Similarly, blocks M−2, M−3, ... are selected in sequence as save blocks whenever a write error occurs. If the data input/output control circuit 14 has a pointer for pointing a position of the last save block or that of the next save block, a step of searching for a vacant block can be omitted, resulting in an efficient operation.

FIG. 8 shows a case where the save operation for the blocks in which a write error occurs results in save blocks N+1 to M and the other blocks 1 to N of a data area for recording normal data. Assume that data has been recorded in the block N, the blocks N−1 and Y are vacant, and a write error occurs in the block X to which data is to be written. If, in this case, the data input/output control circuit 14 determines the block X as defective in write, the block N is designated as a save block; however, data has been recorded in the block N.

Therefore, the data input/output control circuit 14 transfers the data of block N to vacant block Y in the data area, erases the block N, and writes the data, which cannot written to the block X, to the block Y. If a vacant block is generated in a plurality of save blocks by erasing data, data of the last save block is transferred to the vacant block to always occupy all the save blocks. Consequently, the memory area of the EEPROM 15 can be used effectively.

According to the constitution of the above embodiment, the save area is not fixed, and the save blocks are increased in number every time a write error occurs, so that the data area can be used effectively. Further, the save blocks are increased in order from the end block number M to the lower number and, if there is a block N including data, the data of the block N is transferred to a vacant block Y of the data area, and the block N is changed to a save block. Thus, the plural save blocks are not scattered throughout the memory area, and both the data area and save blocks can be easily controlled.

When a vacant block is formed in the plural save blocks by erasing data, data of the finally saved block is transferred to the vacant block, with the result that the memory area of the EEPROM 16 can be used effectively. In the above embodiments, the use state of the block N is not checked until a write error occurs. If the use state of the next block N to be saved has been checked when the block N−1 is used as a save block, and the block N is occupied, data of the block N is transferred to another vacant block, thus using the EEPROM 16 more effectively.

The present invention is not limited to the above embodiments. Various changes and modifications can be made without departing from the scope and spirit of the present invention.

INDUSTRIAL APPLICABILITY

As described above, the present invention provides a very excellent memory card which is economical and practice and in which even if a write error occurs in part of an EEPROM, the EEPROM can be used continuously and the memory area of the EEPROM can be used effectively.

We claim:

1. A memory card apparatus comprising:
   an EEPROM having a data area and a save area, the data area and the save area including a plurality of blocks, each block having a fixed capacity;
   save means for:
   when one of the blocks of the data area is detected as a defective block,
   searching for a vacant block in the save area and writing data, which was to be written to the defective block, to the vacant block in the save area, and
   when all of the blocks of the save area are occupied and one of the blocks of the data area is detected as a defective block, searching for a vacant block in the data area and writing data, which was to be written to the defective block, to the vacant block in the data area; and control means for, when one of the blocks of the data area is used for saving the data that was to be written to the defective block, detecting when a vacant block is generated in the save area, and for transferring the data of the block of the data area that was used for saving the data that was to be written to the defective block to the detected vacant block in the save area.

2. The memory card apparatus according to claim 1, further including a management table, and wherein:

each block of the data area and the save area has a corresponding label, and the save means updates the management table by associating the label of the block that has been used for saving the data that was to be written to the defective block with an address that corresponds to the defective block.

3. The memory card apparatus according to claim 2, wherein the save means associates, in the management table, flag data with labels of the blocks that have not been used for saving the data that was to be written to the defective block, wherein the flag data indicates whether the block whose label is associated therewith is occupied or vacant.

4. The memory card apparatus according to claim 1, wherein when the save means searches for the vacant block in the save area, the save means selects, from among the blocks that are vacant in the save area, the block that has a highest label as compared to other labels.

5. A memory card apparatus comprising:

an EEPROM having a data area that includes a plurality of blocks, each block having a fixed capacity;

save means for, when one of the blocks of the data area is detected as a defective block, searching the data area for a vacant block, and for writing data, which was to be written to the defective block, to the vacant block;

first control means for controlling the save means so that the blocks in which data has been written by the save means are selected so as to be arranged continuously within the data area; and second control means for, when the blocks in which data has been written by the save means are arranged continuously by the first control means and when an occupied block is selected by the first control means, transferring the data of the occupied block to a vacant block and saving the data that was to be written to the defective block in the occupied block.

6. The memory card apparatus according to claim 5, further including a management table, and wherein:

each block has a corresponding label, and the save means updates the management table by associating the label of the block that has been used for saving the data that Was to be written in the defective block with an address that corresponds to the defective block.

7. The memory card apparatus according to claim 6, wherein the save means associates, in the management table, flag data with labels of the blocks that have not been used for saving the data that was to be written to the defective block, wherein the flag data indicates whether the block whose label is associated therewith is occupied or vacant.

8. The memory card apparatus according to claim 5, wherein the first control means selects the blocks in sequence from a block having a highest label to a block having a lowest label.

\* \* \* \* \*